(12) United States Patent
Smith

(10) Patent No.: US 6,353,542 B1
(45) Date of Patent: Mar. 5, 2002

(54) RACK MOUNTING BRACKET FOR MOUNTING HEAVY UNBALANCED EQUIPMENT

(76) Inventor: William Craig Smith, 3401 Moonglow Dr., Garland, TX (US) 75044

( * ) Notice: Subject to any disclaimer, the term of this patent is extended or adjusted under 35 U.S.C. 154(b) by 0 days.

(21) Appl. No.: 09/494,621

(22) Filed: Jan. 31, 2000

(51) Int. Cl.[7] .............................. H02B 1/01; H05K 5/00
(52) U.S. Cl. ...................... 361/825; 361/807; 361/809; 361/810; 361/753; 361/796; 361/730; 361/801; 248/674; 248/220.21
(58) Field of Search ................................. 361/807, 825, 361/752–753, 737, 727, 810, 826, 796, 809, 728–730, 788, 801; 248/201, 674–675, 220.21, 309.1; 211/105.4, 123, 187, 105.1, 204, 87, 175, 207–208

(56) References Cited

U.S. PATENT DOCUMENTS

| | | | | |
|---|---|---|---|---|
| 3,601,879 A | * | 8/1971 | Raickle ........................ | 29/737 |
| 3,718,168 A | * | 2/1973 | Berends .................... | 144/117.1 |
| 4,089,040 A | | 5/1978 | Paulsen ....................... | 361/383 |
| 4,184,726 A | | 1/1980 | Cox ........................... | 312/320 |
| 4,309,018 A | | 1/1982 | Reiss ......................... | 248/503 |
| 4,405,170 A | * | 9/1983 | Raya ........................... | 296/10 |
| 5,153,816 A | * | 10/1992 | Griffin ......................... | 361/832 |
| 5,169,105 A | * | 12/1992 | Yasukawa ................ | 248/205.2 |
| 5,709,359 A | | 1/1998 | Riley .......................... | 248/201 |
| 6,095,660 A | * | 8/2000 | Moriyama et al. .......... | 362/147 |

OTHER PUBLICATIONS

Product Sheets from Newton Instrument Company, Inc.'s Catalog No. 15; pp. 5, 10, 79, 153, 189; Copyright 1996; 5 sheets.

* cited by examiner

Primary Examiner—Jayprakash N. Gandhi
Assistant Examiner—Thanh Y. Tran

(57) ABSTRACT

The present invention provides a chassis mount for mounting an electronic equipment chassis to a rack that has parallel mounting columns with opposing front and rear flanges. The chassis mount has front brackets that are fixedly attached to the electronic equipment chassis and positively engageable with the front flanges of the mounting columns. The chassis mount also has rear brackets movably attached to the electronic equipment chassis and locatable proximate to the rear flanges of the mounting columns. A binding mechanism is coupled to the front and rear brackets to form a clamp therewith that binds the columns between the front and rear brackets and secures the electronic equipment chassis to the rack.

21 Claims, 2 Drawing Sheets

RACK MOUNTING BRACKET FOR MOUNTING HEAVY UNBALANCED EQUIPMENT

TECHNICAL FIELD OF THE INVENTION

The present invention is directed, in general, to a mounting bracket for an equipment rack, and, more specifically, to a mounting bracket to securely mount heavy electronics equipment to the columns of an equipment rack.

BACKGROUND OF THE INVENTION

Earthquakes, floods, hurricanes and other natural catastrophes are aggravated by confusion and lack of information. One system heavily relied on by victims of such catastrophes is the public telephone system. If the public telephone system is working, disaster relief efforts can be coordinated and people involved in the disaster can seek assistance and be kept informed. Regulatory authorities and consumers both expect the public telephone system to survive natural catastrophes, or at least to be among the first systems to be put back into service.

The survivability of a telephone system is, among other things, dependant on the survivability of locations housing the electronics equipment that forms the heart of the system. The equipment at such locations must remain operational for the telephone system to remain serviceable.

Electronics equipment used in the telecommunications industry is typically configured as a number of electronic modules, each of which is housed in a case or chassis, that combine to make up the overall system. These modules are mounted to equipment racks that, to the casual observer, have the appearance of a large number of closely packed drawers with only the faces of the modules being visible. A typical prior art equipment rack has a pair of columns, which may be C-shaped vertical channels, between which a number of electronic equipment chassis are mounted, one above the other. Unless the rack can withstand the ravages of a natural disaster, such as an earthquake, and retain the equipment mounted thereon, the telephone system risks being rendered inoperable.

For this reason, a number of regulatory agencies require the use of rack mounting systems capable of withstanding prescribed vibration levels approximating that of an earthquake. In the majority of equipment racks now in use, each electronic equipment chassis is mounted to the rack by using two "ear" brackets, one fastened to each side of the chassis. The other end of each "ear" bracket is attached to one flange of the column by one or more bolts or screws. This type of equipment rack requires the mounting brackets to be located on or near the balance point (center of gravity) of the chassis. Lighter pieces of electronics equipment mounted in this manner generally meet most requirements regarding earthquake survivability. However, heavier pieces of equipment with an "ear" bracket attached to the chassis at the chassis balance point and fastened to a single flange of an equipment rack frequently will not meet earthquake survivability requirements.

Additional factors, besides earthquake survivability, must also be considered in selecting the right rack to mount electronics equipment. Because the electronic equipment chassis must be removable for maintenance purposes or to upgrade the electronics inside, easy removal and ready access are prerequisites. Space considerations for the equipment must also be considered. For these reasons most equipment racks are only accessible from the front and the electronics equipment is mounted so close together that one chassis abuts, or nearly abuts, the adjacent chassis.

Prior art solutions satisfying earthquake survivability requirements have included locating the electronics equipment on shelving supported by brackets that provide additional support. Shelving and brackets, however, takes up space that could otherwise be devoted to more electronic equipment. The shelving also increases the weight of the equipment rack and may block airflow inside the equipment rack. Another prior art solution called for the use of a double-sided mount with screw fasteners attached to each flange of the column. This, however, required access to both sides of the mounting rack. In addition, most prior art equipment racks only have mounting holes on the front side of the rack.

Another prior art solution is to use a four channel rack mounting system. A four channel rack has two vertical C-channel racks adjacent to one another on each side of the rack between which the equipment is mounted. While such an equipment rack will readily withstand about any earthquake testing, the problem of access to both sides of the rack remains.

Therefore, what is needed in the art is a chassis mount that can be attached to an electronic equipment chassis for mounting the chassis in an equipment rack where the chassis is supported by two surfaces, but does not require access to both sides of the rack in order to install the chassis.

SUMMARY OF THE INVENTION

To address the above-discussed deficiencies of the prior art, the present invention provides a chassis mount for mounting an electronic equipment chassis to a rack that has parallel mounting columns with opposing front and rear flanges. The chassis mount has front brackets that are fixedly attached to the electronic equipment chassis and positively engageable with the front flanges of the mounting columns. The chassis mount also has rear brackets movably attached to the electronic equipment chassis and locatable proximate to the rear flanges of the mounting columns. A binding mechanism is coupled to the front and rear brackets to form a clamp therewith that binds the columns between the front and rear brackets and secures the electronic equipment chassis to the rack.

The present invention therefore broadly introduces a chassis mount that has more than one point of contact to support an electronic equipment chassis in a rack. The mount provides a clamp that can be bear against both mounting columns of a rack without requiring physical access to both flanges of the mounting columns. This mount is particularly advantageous, because it permits a heavy electronic equipment chassis to be mounted without the requirement that the chassis be centered in the rack. The chassis may thus be mounted at its center of gravity, or in any position with respect thereto. In some equipment mounting applications, it may be necessary to "flush mount" the equipment, with the chassis "flush" with the front flange of the rack. Increased resistance to the torque resulting from the off-center mounting is, at least partially, counteracted by the two-surface clamping action of the mount.

In one embodiment of the invention the chassis mount has a rack mounting bolt couplable to the front brackets to provide additional support to the chassis. In another embodiment, unthreaded pins couplable to the front brackets are used to provide additional support to the chassis. In an advantageous embodiment, the chassis mount has an adjustment slot in at least one of the front and rear brackets to permit the mount binding mechanism to be adjusted to accommodate columns having various web dimensions. In another embodiment, the chassis mount has adjustment slots in the front and rear brackets to permit the mount binding mechanism to be adjusted to accommodate columns having flanges of varying dimensions.

In still another embodiment, the chassis mount has a bridge on the front brackets to support the rear brackets and hold them in place before the binding mechanism binds them against the rear flanges of the mounting columns. In yet another embodiment of the invention, the mount binding mechanism includes an adjusting screw which engages a nut adjacent the rear brackets for tightening the adjusting screw.

Other embodiments of the invention include methods of manufacturing a chassis mount. In one embodiment, the method comprises forming front brackets to be fixedly attached to the chassis and positively engageable with the front flanges of the mounting columns. Rear brackets are formed such that they are movably attached to the chassis and locatable proximate the rear flanges. A binding mechanism is formed to couple the front and rear brackets together so they form a clamp that can bind the mounting columns between the front and rear brackets.

Yet another aspect of the invention provides an electronic equipment assembly. In one embodiment, the electronic equipment assembly includes an electronic equipment chassis and a rack with parallel mounting columns that have opposing front and rear flanges. The equipment assembly also includes a chassis mount to secure the electronic equipment chassis to the rack.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
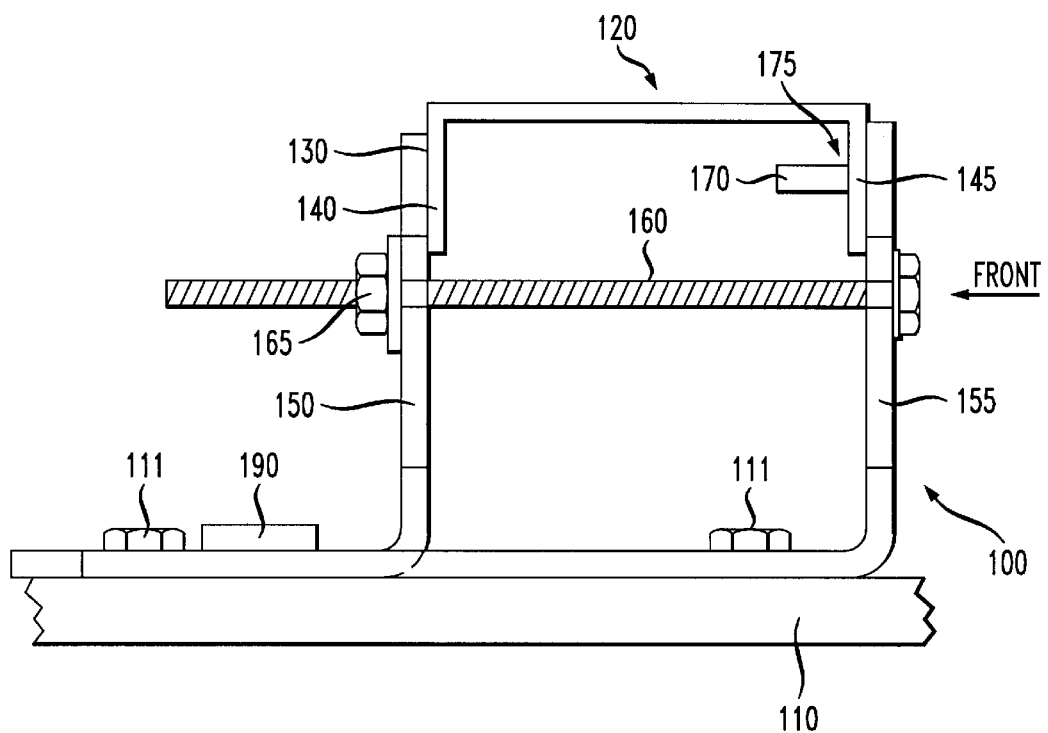
FIG. 1A illustrates a plan view of an embodiment of a chassis mount constructed in accordance with the principles of the present invention.

Referring initially to FIG. 1A, illustrated is a plan view of an embodiment of a chassis mount 100 constructed in accordance with the principles of the present invention. The illustrated chassis mount 100 is one of a cooperating pair of chassis mounts 100 that are used to mount an electronic equipment chassis 110 to a rack 120 having parallel mounting columns (one of which is designated 130) with opposing front and rear flanges 145, 140.

For purposes of simplicity, only one of the pair of mounts will be hereinafter described. Those skilled in the pertinent art will readily understand that the other mount is substantially similar to the mount 100 illustrated and described herein.

The chassis mount 100 is made up of two brackets: a front bracket 155 and a rear bracket 150. The front bracket 155 is fixedly attached to an electronic equipment chassis 110. In the instant case, the front bracket 155 is attached to the chassis 110 by fasteners 111, which are illustrated as being bolts or threaded screws, but can be any other type of fastener. Of course, the front bracket 155 may be a permanent part of the chassis 110. As hereinafter described, the front bracket 155 is positively engageable with the front flange 145 of the mounting column 130. The rear bracket 150 is movably attached to the electronic equipment chassis 110 and, as hereinafter described, locatable proximate to the rear flange 140 of the mounting column 130. The chassis mount 100 has a binding mechanism 160, coupled to the front and rear brackets 155, 150, that provides the necessary action and connection between the front and rear brackets 155, 150 to cause them to act as a clamp to secure the chassis 110 to the mounting column 130. Also illustrated is a particularly useful embodiment of the invention, which is an unthreaded rack mounting pin 170 inserted in a rack aperture 175 in the mounting column 130 to provide support for the chassis 110 as it is being installed.

Figure 1B:
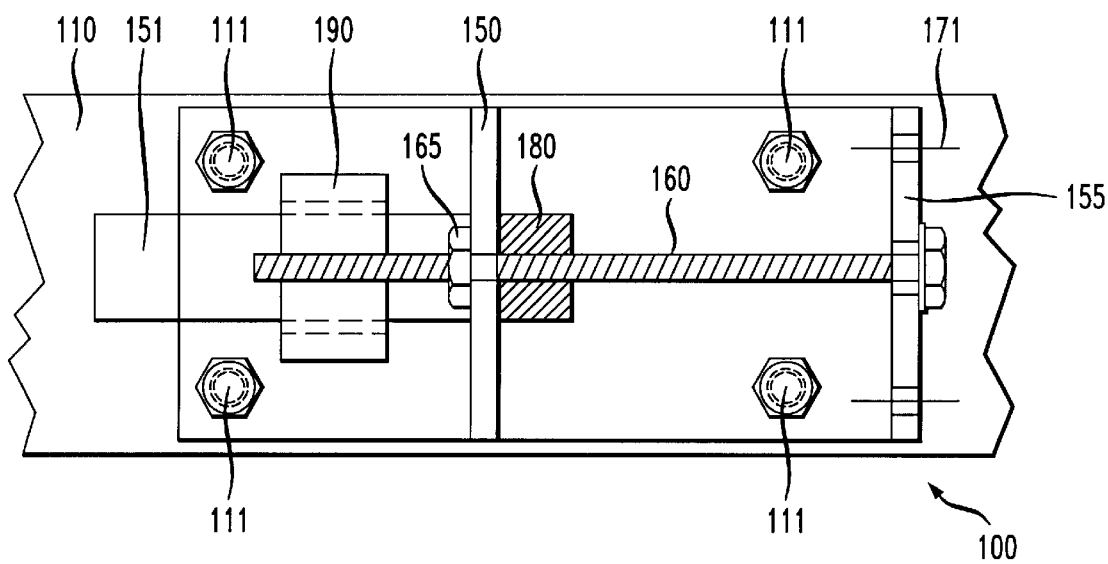
FIG. 1B illustrates a side elevational view of the chassis mount of FIG. 1A.

Turning now to FIG. 1B, illustrated is a side elevational view of the embodiment of the chassis mount 100 of FIG. 1A. This view of the chassis mount 100 shows certain additional features of the mount 100 that are not readily apparent in FIG. 1A. It can be seen that the front bracket 155 is fixedly attached to the electronic equipment chassis 110 by four fasteners 111. This embodiment of the invention also provides a guide to support the rear bracket 150 and provide a path for moving the rear bracket 150 back and forth. The guide is made up of a bracket guide slot 180 located in the front bracket 155 in which a slot end 151 of the rear bracket 150 is located.

To retain and support the slot end 151 of the rear bracket 150 in the bracket guide slot 180, particularly while the chassis 110 and chassis mount 100 are being handled, an advantageous embodiment of the invention provides for a bridge 190. The bridge 190 is placed across the bracket guide slot 180 and keeps the slot end 151 of the rear bracket 150 in the bracket guide slot 180. Those skilled in the pertinent art will understand that any configuration of a mechanism that permits the rear bracket 150 to be movable in the manner described herein is within the intended scope of the present invention.

Referring jointly to FIGS. 1A and 1B, the operation of the chassis mount 100 can now be explained. The chassis mount 100 is fixedly attached to an electronic equipment chassis 110 by several fasteners 111 on the front bracket 155. The chassis 110 is positioned in the rack 120 with the front bracket 155 in front of the front flange 145 of the column 130 and the rear bracket 150 proximate the opposing rear flange 140. Because the typical electronic equipment chassis 110 weighs at least several pounds, in order to hold the chassis 110 in position while it is being mounted, an unthreaded rack mounting pin 170 is inserted through a bracket aperture 171 and a corresponding rack aperture 175 in the mounting column 130. In the case of a very heavy chassis 110, more than one rack mounting pin 170 can be used for support. Those skilled in the pertinent art will understand that a chassis mount 100 without a method to support the chassis 110 as it is being mounted, such as the rack mounting pin 170, is also within the scope of the intended invention.

After the chassis 110 is placed in position in the rack 120, the binding mechanism 160 is used to draw the rear bracket 155 toward the rear flange 140. The illustrated embodiment of the invention shows an adjustment screw as the binding mechanism 160. This embodiment also shows a nut 165 adjacent the inner bracket 150 to tighten the adjusting screw 160. Other methods or devices used to tighten an adjusting screw 160 are also within the scope of the present invention, such as, for example, a threaded aperture in the rear bracket 150. As the rear bracket 150 moves in the bracket slot 180 towards the front bracket 155, the front and rear brackets 155, 150 exert a clamping action on the front and rear flanges 145, 140 of the column 130 and bind them between the two brackets 155, 150. The front bracket 155 is now positively engaged with the front flange 145.

Those of skilled in the pertinent art will understand that, regardless of the operational and aesthetic design features incorporated in the brackets 150, 155 making up the chassis mount 100, any such mount 100 that functions in the manner set forth herein is within the intended scope of the present invention.

Figure 2:
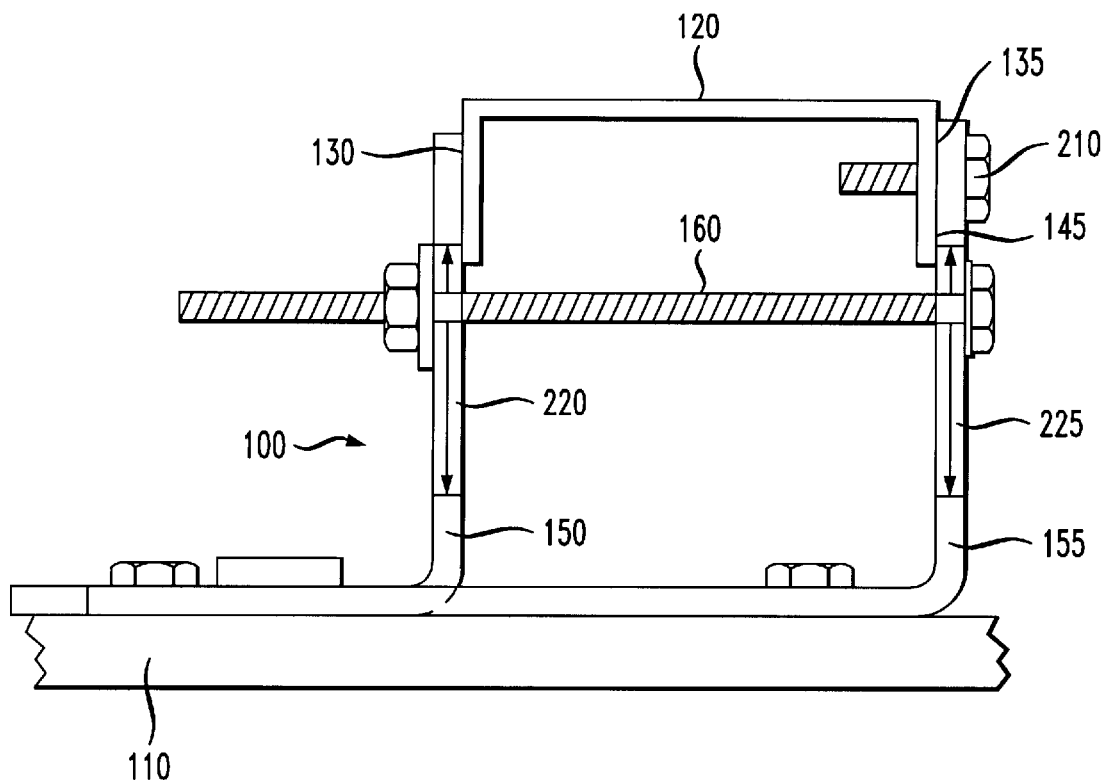
FIG. 2 illustrates a plan view of an alternative embodiment of a chassis mount constructed in accordance with the principles of the present invention.

Turning now to FIG. 2, illustrated is a plan view of a chassis mount 200 incorporating additional optional features of the present invention. One such optional feature is a threaded rack mounting bolt 210 used to secure the front bracket 155 to the front flange 145 and provide support to the chassis 110. This is particularly useful when mounting a heavy chassis 110 requiring additional support. The threaded rack mounting bolt 210 also prevents one side of the chassis 110 from moving while the binding mechanism 160 on the other side is being adjusted.

Most columns 130 on the racks 120 are made up of a single C-shaped metal channel. There is (contrary to what one may expect) no standard size channel in worldwide use, so it is advantageous if the chassis mount 100 can be adjusted to accommodate different sizes of channels, particularly to accommodate the differing depths of webbing. Illustrated is an embodiment of the invention that permits the chassis mount 100 to be adjusted so that different web depths can be accommodated. Respectively located on the front and rear brackets 155, 150 are slots 225, 220 that permit the binding mechanism 160 to be moved so that differing web depths or column 130 sizes can be accommodated by the same chassis mount 100.

Figure 3:
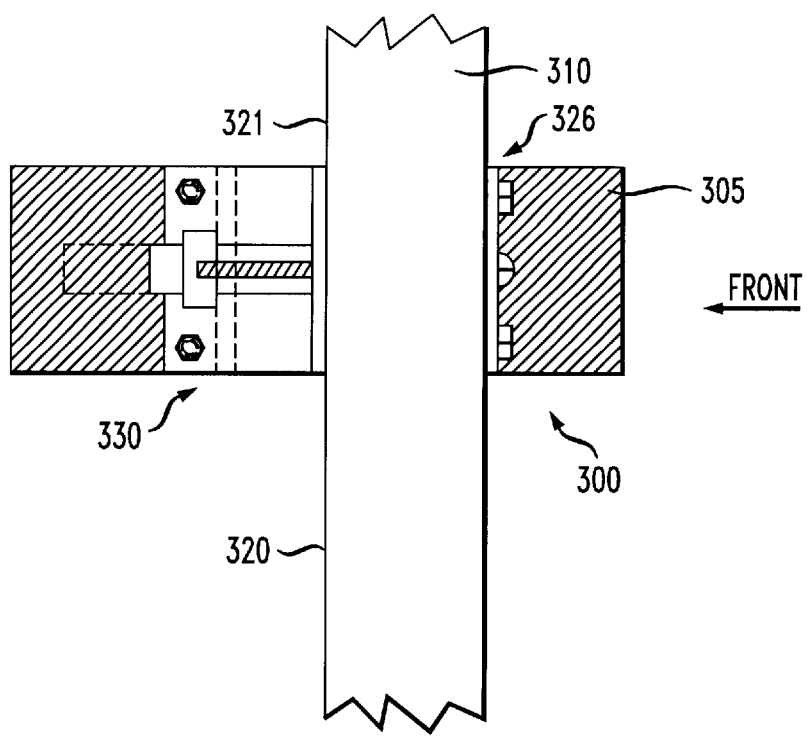
FIG. 3 illustrates an electronic equipment assembly supporting an electronic equipment chassis on a rack.

Turning now to FIG. 3, illustrated is an electronic equipment assembly 300 made up of an electronic equipment chassis 305 mounted on a rack 310 with a chassis mount 330. The rack 310 has parallel mounting columns (one of which is designated 320) with opposing front and rear flanges 326, 321. A chassis mount 330, of the type described above, is attached to the equipment assembly 300 and used to mount the chassis 305 on the rack 310 in the manner previously described herein.

The present invention also provides a method of manufacturing a chassis mount for mounting an electronic equipment chassis to a rack. The method of manufacturing the chassis mount is clear from the foregoing detailed description and illustrations. Other manufacturing methods and techniques, however, are within the scope of the intended invention.

Although the present invention has been described in detail, those skilled in the art should understand that they can make various changes, substitutions and alterations herein without departing from the spirit and scope of the invention in its broadest form.

What is claimed is:

1. For use in mounting an electronic equipment chassis to a rack having parallel mounting columns with opposing front and rear flanges, a chassis mount, comprising:
   front brackets fixedly attached to said chassis and positively engageable with said front flanges;
   rear brackets movably attached to said chassis and locatable proximate said rear flanges; and
   a binding mechanism, coupled to said front and rear brackets to form a clamp therewith to bind said columns between said front and rear brackets and thereby secure said electronic equipment chassis to said rack.

2. The chassis mount as recited in claim 1 further comprising rack mounting bolts couplable to said front brackets to provide additional support to said chassis.

3. The chassis mount as recited in claim 1 further comprising unthreaded pins couplable to said front brackets to provide additional support to said chassis.

4. The chassis mount as recited in claim 1 wherein said front brackets and said rear brackets have an adjustment slot therein.

5. The chassis mount as recited in claim 1 further comprising a bridge on said front brackets for supporting said rear brackets.

6. The chassis mount as recited in claim 1 wherein said binding mechanism comprises an adjusting screw.

7. The chassis mount as recited in claim 6 further comprising a nut adjacent said rear brackets for tightening said adjusting screw.

8. A method of manufacturing a chassis mount for use in mounting an electronic equipment chassis to a rack having parallel mounting columns with opposing front and rear flanges, comprising:
   forming front brackets to be fixedly attached to said chassis and positively engageable with said front flanges;
   forming rear brackets movably to be attached to said chassis and locatable proximate said rear flanges; and
   forming a binding mechanism, coupled to said front and rear brackets to form a clamp therewith to bind said columns between said front and rear brackets and thereby secure said electronic equipment chassis to said rack.

9. The method as recited in claim 8 further comprising providing rack mounting bolts couplable to said front brackets to provide additional support to said chassis.

10. The method as recited in claim 8 further comprising providing unthreaded pins couplable to said front brackets to provide additional support to said chassis.

11. The method as recited in claim 8 further comprising forming an adjustment slot in said front brackets and said rear brackets.

12. The method as recited in claim 8 further comprising forming a bridge on said front brackets for supporting said rear brackets.

13. The method as recited in claim 8 wherein said binding mechanism comprises an adjusting screw.

14. The method as recited in claim 13 further comprising providing a nut adjacent said rear brackets for tightening said adjusting screw.

15. An electronic equipment assembly, comprising:
   an electronic equipment chassis;
   a rack having parallel mounting columns with opposing front and rear flanges; and
   a chassis mount, including:
      front brackets fixedly attached to said chassis and positively engageable with said front flanges;

rear brackets movably attached to said chassis and locatable proximate said rear flanges; and a binding mechanism, coupled to said front and rear brackets to form a clamp therewith to bind said columns between said front and rear brackets and thereby secure said electronic equipment chassis to said rack.

16. The assembly as recited in claim 15 further comprising a rack mounting bolt to provide additional support to said chassis.

17. The assembly as recited in claim 15 further comprising an unthreaded pin to provide additional support to said chassis.

18. The assembly as recited in claim 15 wherein said front brackets and said rear brackets have an adjustment slot therein.

19. The assembly as recited in claim 15 further comprising a bridge on said front brackets for supporting said rear brackets.

20. The assembly as recited in claim 15 wherein said binding mechanism comprises an adjusting screw.

21. The assembly as recited in claim 20 further comprising a nut adjacent said rear brackets for tightening said adjusting screw.

* * * * *